(12) United States Patent
Ahn et al.

(10) Patent No.: US 8,222,625 B2
(45) Date of Patent: Jul. 17, 2012

(54) NON-VOLATILE MEMORY DEVICE INCLUDING PHASE-CHANGE MATERIAL

(75) Inventors: Dong-ho Ahn, Suwon-si (KR); Hideki Horii, Seoul (KR); Soon-oh Park, Suwon-si (KR); Young-hyun Kim, Seoul (KR); Hee-ju Shin, Yongin-si (KR); Jin-ho Oh, Seongnam-si (KR); Carl H. Schell, Waterford, MI (US); Jonathan D. Maimon, Manassas, VA (US); Stephen J. Hudgens, Santa Clara, CA (US)

(73) Assignees: Samsung Electronics Co., Ltd. (KR); Ovonyx, Inc., Rochester Hills, MI (US)

( * ) Notice: Subject to any disclaimer, the term of this patent is extended or adjusted under 35 U.S.C. 154(b) by 241 days.

(21) Appl. No.: 12/657,715

(22) Filed: Jan. 26, 2010

(65) Prior Publication Data
US 2011/0049458 A1    Mar. 3, 2011

(30) Foreign Application Priority Data
Aug. 27, 2009 (KR) .................. 10-2009-0079766

(51) Int. Cl.
*H01L 45/00* (2006.01)
(52) U.S. Cl. .................. 257/2; 257/E45.001
(58) Field of Classification Search ........ 257/2, E45.011
See application file for complete search history.

(56) References Cited

U.S. PATENT DOCUMENTS

| | | | |
|---|---|---|---|
| 6,087,674 A | 7/2000 | Ovshinsky et al. | |
| 2007/0170881 A1* | 7/2007 | Noh et al. | 318/453 |
| 2007/0221905 A1 | 9/2007 | Liu | |
| 2008/0135825 A1 | 6/2008 | Lee et al. | |
| 2010/0044664 A1* | 2/2010 | Liu | 257/2 |

FOREIGN PATENT DOCUMENTS

| | | |
|---|---|---|
| KR | 100706805 B1 | 4/2007 |
| KR | 1020080052083 A | 6/2008 |
| KR | 1020080114793 A | 12/2008 |
| KR | 1020090003881 A | 1/2009 |

* cited by examiner

*Primary Examiner* — Benjamin Sandvik
*Assistant Examiner* — Whitney T Moore
(74) *Attorney, Agent, or Firm* — Onello & Mello, LLP

(57) ABSTRACT

A non-volatile memory device including a phase-change material, which has a low operating voltage and low power consumption, includes a lower electrode; a phase-change material layer formed on the lower electrode so as to be electrically connected to the lower electrode, wherein the phase-change material layer includes a phase-change material having a composition represented by $Sn_XSb_YTe_Z$ or, alternatively with substitutions, in whole or in part, of silicon and/or indium for tin, arsenic and/or bismuth for antimony, and selenium for tellurium; and an upper electrode formed on the phase-change material layer so as to be electrically connected to the phase-change material layer. Here, $0.001 \leq X \leq 0.3$, $0.001 \leq Y \leq 0.8$, $0.1 \leq Z \leq 0.8$, and $X+Y+Z=1$.

4 Claims, 9 Drawing Sheets

NON-VOLATILE MEMORY DEVICE INCLUDING PHASE-CHANGE MATERIAL

CROSS-REFERENCE TO RELATED APPLICATIONS

This application claims the benefit of Korean Patent Application No. 10-2009-0079766, filed on Aug. 27, 2009, in the Korean Intellectual Property Office, the disclosure of which is incorporated herein in its entirety by reference.

BACKGROUND

The inventive concept relates to a memory device, and more particularly, to a non-volatile memory device including a phase-change material.

Semiconductor products are decreasing in size and benefit from high-capacity data processing. These semiconductor products can include non-volatile memory devices, and increases in the operating speed and integration of the non-volatile memory are advantageous. Examples of non-volatile memory devices include a phase-change random access memory (PRAM) having a storage element formed of a phase-change material. The phase-change material has a crystalline state or an amorphous state depending on the temperature of the phase-change material. Resistivity in the crystalline state is lower than resistivity in the amorphous state. The non-volatile memory devices are designed to operate at low voltage and low power consumption in order to be used in semiconductor products.

SUMMARY

According to an aspect of the inventive concept, there is provided a non-volatile memory device including a lower electrode; a phase-change material layer formed on the lower electrode so as to be electrically connected to the lower electrode, wherein the phase-change material layer includes a phase-change material having a composition represented by Formula 1, below; and an upper electrode formed on the phase-change material layer so as to be electrically connected to the phase-change material layer;

$$Sn_X Sb_Y Te_Z,  \text{[Formula 1]}$$

where $0.001 \leq X \leq 0.3$, $0.001 \leq Y \leq 0.8$, $0.1 \leq Z \leq 0.8$, and $X+Y+Z=1$.

In some embodiments of the inventive concept, the phase-change material may have a composition represented by Formula 2, below, obtained by replacing a portion or all of the tin (Sn) of Formula 1 with silicon (Si) and/or indium (In):

$$(Sn_U R_{(1-U)})_X Sb_Y Te_Z,  \text{[Formula 2]}$$

where $0.001 \leq X \leq 0.3$, $0.001 \leq Y \leq 0.8$, $0.1 \leq Z \leq 0.8$, $X+Y+Z=1$, R is Si and/or In, and $0 \leq U \leq 1$.

In some embodiments of the inventive concept, the phase-change material may have a composition represented by Formula 3, below, obtained by replacing a portion or all of the antimony (Sb) of Formula 1 with arsenic (As) and/or bismuth (Bi):

$$Sn_X (Sb_V Q_{(1-V)})_Y Te_Z,  \text{[Formula 3]}$$

where $0.001 \leq X \leq 0.3$, $0.001 \leq Y \leq 0.8$, $0.1 \leq Z \leq 0.8$, $X+Y+Z=1$, Q is As and/or Bi, and $0 \leq V \leq 1$.

In some embodiments of the inventive concept, the phase-change material may have a composition represented by Formula 4, below, obtained by replacing a portion or all of the tellurium (Te) of Formula 1 with Se:

$$Sn_X Sb_Y (Te_W Se_{(1-W)})_Z,  \text{[Formula 4]}$$

where $0.001 \leq X \leq 0.3$, $0.001 \leq Y \leq 0.8$, $0.1 \leq Z \leq 0.8$, $X+Y+Z=1$, and $0 \leq W \leq 1$.

In some embodiments of the inventive concept, the phase-change material may have a composition represented by Formula 5, below, obtained by replacing a portion or all of the Sn of Formula 1 with Si and/or In and replacing a portion or all of the Sb of Formula 1 As and/or Bi:

$$(Sn_U R_{(1-U)})_X (Sb_V Q_{(1-V)})_Y Te_Z,  \text{[Formula 5]}$$

where $0.001 \leq X \leq 0.3$, $0.001 \leq Y \leq 0.8$, $0.1 \leq Z \leq 0.8$, $X+Y+Z=1$, R is Si and/or In, $0 \leq U \leq 1$, Q is As and/or Bi, and $0 \leq V \leq 1$.

In some embodiments of the inventive concept, the phase-change material may have a composition represented by Formula 6, below, obtained by replacing a portion or all of the Sn of Formula 1 with Si and/or In and replacing a portion or all of the Te of Formula 1 with Se:

$$(Sn_U R_{(1-U)}) Sb_Y (Te_W Se_{(1-W)})_Z,  \text{[Formula 6]}$$

where $0.001 \leq X \leq 0.3$, $0.001 \leq Y \leq 0.8$, $0.1 \leq Z \leq 0.8$, $X+Y+Z=1$, R is Si or In, $0 \leq U \leq 1$, and $0 \leq W \leq 1$.

In some embodiments of the inventive concept, the phase-change material may have a composition represented by Formula 7, below, obtained by replacing a portion or all of the Sb of Formula 1 with As and/or Bi and replacing a portion or all of the Te of Formula 1 with Se:

$$Sn_X (Sb_V Q_{(1-V)})_Y (Te_W Se_{(1-W)})_Z,  \text{[Formula 7]}$$

where $0.001 \leq X \leq 0.3$, $0.001 \leq Y \leq 0.8$, $0.1 \leq Z \leq 0.8$, $X+Y+Z=1$, Q is As and/or Bi, $0 \leq V \leq 1$, and $0 \leq W \leq 1$.

In some embodiments of the inventive concept, the phase-change material may have a composition represented by Formula 8, below, obtained by replacing a portion or all of the Sn of Formula 1 with Si and/or In, replacing a portion or all of the Sb of Formula 1 with As and/or Bi, and replacing a portion or all of the Te of Formula 1 with Se:

$$(Sn_U R_{(1-U)})_X (Sb_V Q_{(1-V)})_Y (Te_W Se_{(1-W)})_Z,  \text{[Formula 8]}$$

where $0.001 \leq X \leq 0.3$, $0.001 \leq Y \leq 0.8$, $0.1 \leq Z \leq 0.8$, $X+Y+Z=1$, R is Si and/or In, $0 \leq U \leq 1$, Q is As and/or Bi, $0 \leq V \leq 1$, and $0 \leq W \leq 1$.

According to another aspect of the inventive concept, there is provided a non-volatile memory device including a lower electrode; a phase-change material layer formed on the lower electrode so as to be electrically connected to the lower electrode, wherein the phase-change material layer includes a phase-change material having a composition represented by Formula 9, below; and an upper electrode formed on the phase-change material layer so as to be electrically connected to the phase-change material layer;

$$M_A (Sn_X Sb_Y Te_Z)_{(1-A)},  \text{[Formula 9]}$$

where M is a metal, $0.001 \leq A \leq 0.3$, $0.001 \leq X \leq 0.3$, $0.001 \leq Y \leq 0.8$, $0.1 \leq Z \leq 0.8$, and $X+Y+Z=1$.

In some embodiments of the inventive concept, the metal may include at least one selected from the following group: aluminum (Al), gallium (Ga), zinc (Zn), titanium (Ti), chromium (Cr), manganese (Mn), iron (Fe), cobalt (Co), nickel (Ni), molybdenum (Mo), ruthenium (Ru), palladium (Pd), hafnium (Hf), tantalum (Ta), iridium (Ir), platinum (Pt), zirconium (Zr), thallium (Tl), palladium (Pd), and polonium (Po).

According to another aspect of the inventive concept, there is provided a memory card including a memory, the memory including a non-volatile memory device having a phase-change material according to the inventive concept, and a controller for controlling the memory and sending and receiving electric signals to and from the memory.

According to another aspect of the inventive concept, there is provided a system including a memory, the memory including a non-volatile memory device having a phase-change material according to the inventive concept, a processor for communicating with the memory through a bus, and an input/output device for communicating with the bus.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
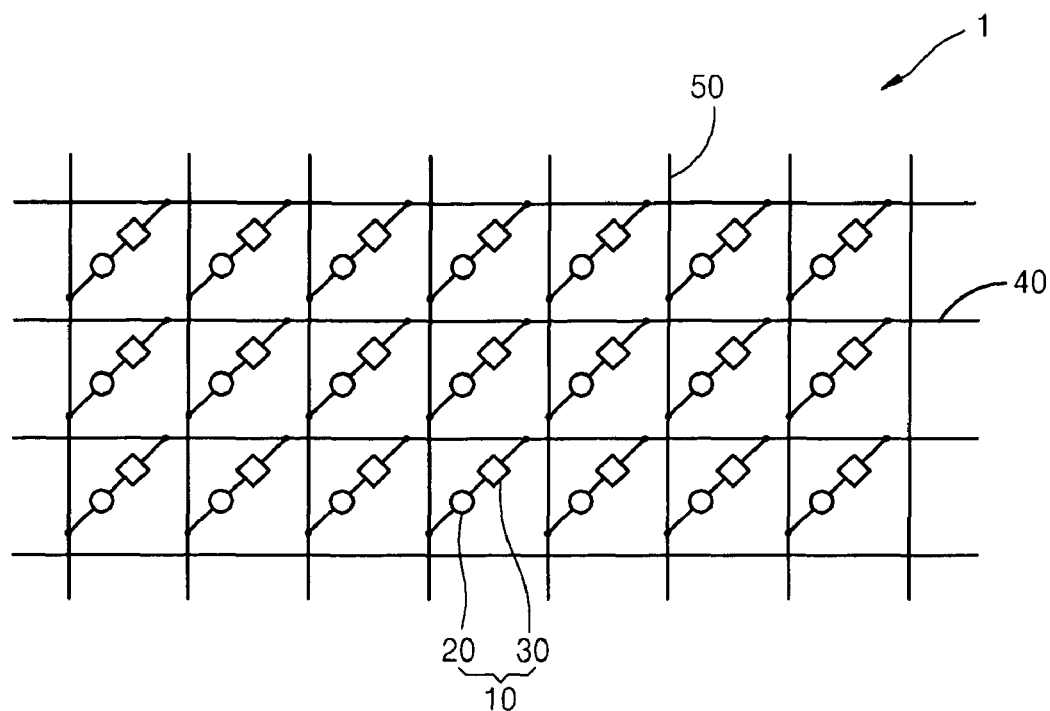
FIG. 1 is a schematic diagram of a non-volatile memory array according to some embodiments of the inventive concept.

Reference will now be made in detail to exemplary embodiments, examples of which are illustrated in the accompanying drawings. The invention, however, is not limited to the embodiments described and illustrated hereinafter, and the embodiments herein are rather introduced to facilitate easy understanding of the scope and spirit of exemplary embodiments. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element; alternatively, intervening elements may be present. In contrast, when an element is referred to as being "directly on," "directly connected to" or "directly coupled to" another element or layer, no intervening elements or layers are present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term, "above," may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms, "a," "an" and "the," are intended to include the plural forms as well, unless the context clearly indicates otherwise. It will be further understood that the terms, "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be construed to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, and their shapes may be not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. For example, if a particular composition is referenced, practical, imperfect realities may apply; e.g., the potential presence of at least trace impurities can be understood as being within the scope of the description and claims.

Hereinafter, the exemplary embodiments of the inventive concept will be described in detail with reference to the accompanying drawings. In the drawings, variations from the shapes of the illustrations as a result, for example, of manufacturing techniques and/or tolerances, are to be expected. Thus, the example embodiments should not be construed as limited to the particular shapes of regions illustrated herein but may be to include deviations in shapes that result, for example, from manufacturing.

A non-volatile memory array 1 according to some embodiments of the inventive concept is schematically diagrammed in FIG. 1.

Referring to FIG. 1, the non-volatile memory array 1 according to the present embodiment includes unit cells 10 of a plurality of memory devices arranged in a matrix form. Each of the unit cells 10 of the memory devices includes a memory portion 20 and an access portion 30. The unit cells 10 of the memory devices are electrically connected to first address lines 40 and second address lines 50. The first address lines 40 and the second address lines 50 cross each other at a certain angle and are arranged two-dimensionally. The certain angle may be a right angle, but the inventive concept is not limited thereto. Either the first address lines 40 or the second address lines 50 may be electrically connected to bit lines, and the other may be electrically connected to word lines.

The memory portion 20 may include a phase-change material, a ferroelectric material, or a magnetic material. The state of the memory portion 20 may depend on the amount of current supplied through a bit line.

The access portion 30 controls the supply of a current to the memory portion 20, according to the voltage of a word line. The access portion 30 may be a diode, a bipolar transistor, or a MOS transistor.

In the following embodiments of the inventive concept, a phase-change random access memory (PRAM) including a phase-change material is used as a memory device of the memory portion 20. However, the inventive concept is not limited to these embodiments, and the technical spirit of the inventive concept may also be applied to resistance random access memory (RRAM), ferroelectric RAM (FRAM), magnetic RAM (MRAM), or the like.

Figure 2:
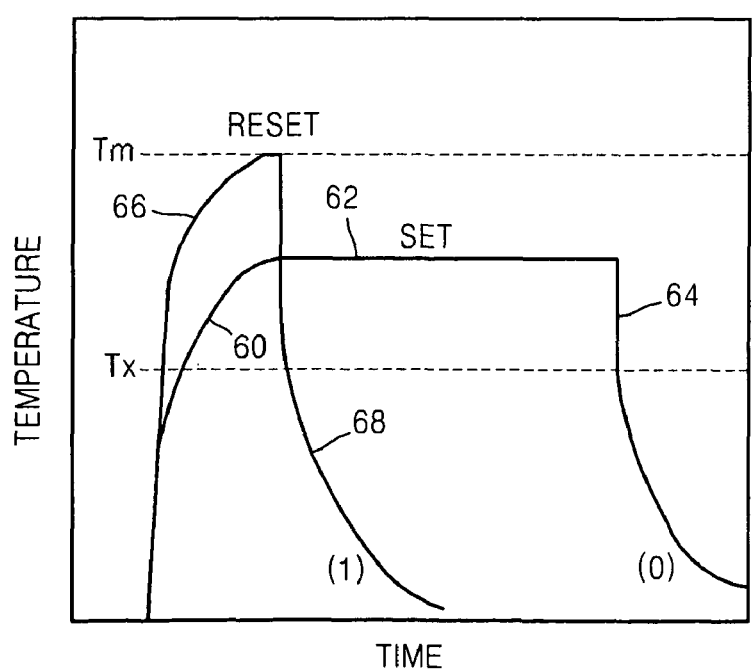
FIG. 2 is a graph for explaining a method of performing a set or reset programming operation on a phase-change material layer included in a non-volatile memory device according to some embodiments of the inventive concept.

A method of performing a set or reset programming operation on a phase-change material layer included in a non-volatile memory device according to some embodiments of the inventive concept is illustrated in the form of a time-temperature profile in FIG. 2.

Referring to FIG. 2, when the phase-change material layer is heated 60 to a temperature between a crystallization temperature, Tx, and a melting point, Tm, maintained 62 at this temperature for a certain period of time and is then slowly cooled 64, the phase-change material layer enters into a crystalline state. The crystalline state is referred to as a set state, in which a data value '0' has been stored. On the other hand, when the phase-change material layer is heated 66 to a temperature equal to or greater than the melting point Tm and is then rapidly cooled 68, the phase-change material layer enters into an amorphous state. The amorphous state is referred to as a reset state, in which a data value '1' has been stored. Accordingly, data may be stored by supplying a current to the phase-change material layer, and data may be read out by measuring the resistance of the phase-change material layer. The heating temperature of the phase-change material is proportional to the amount of current flowing through the phase-change material layer. As the amount of current increases, it is more difficult to achieve high integration. Since transformation into the amorphous state (reset state) requires more current than transformation into the crystalline state (set state), power consumption of a memory device increases. Accordingly, to reduce the power consumption, a phase-change material should be heated with a small amount of current. In particular, a current required for transformation into the amorphous state (that is, a reset current) needs to be reduced in order to achieve high integration.

A non-volatile memory device including such a phase-change material layer generally includes a plurality of unit cells, each including an access portion and a memory portion having the phase-change material layer. The phase-change material layer is generally disposed between a lower electrode and an upper electrode, and the access portion is electrically connected to the lower electrode. In this regard, the phase-change material layer is heated to a temperature between a crystallization temperature and a melting point or a temperature equal to or greater than the melting point due to the amount of write current flowing in the lower electrode and the access portion. In other words, when the write current flows in the lower electrode and the access portion, joule heat may be generated at an interface between the lower electrode and the phase-change material layer, and a temperature caused by the joule heat may depend on the amount of the write current.

Figure 3:
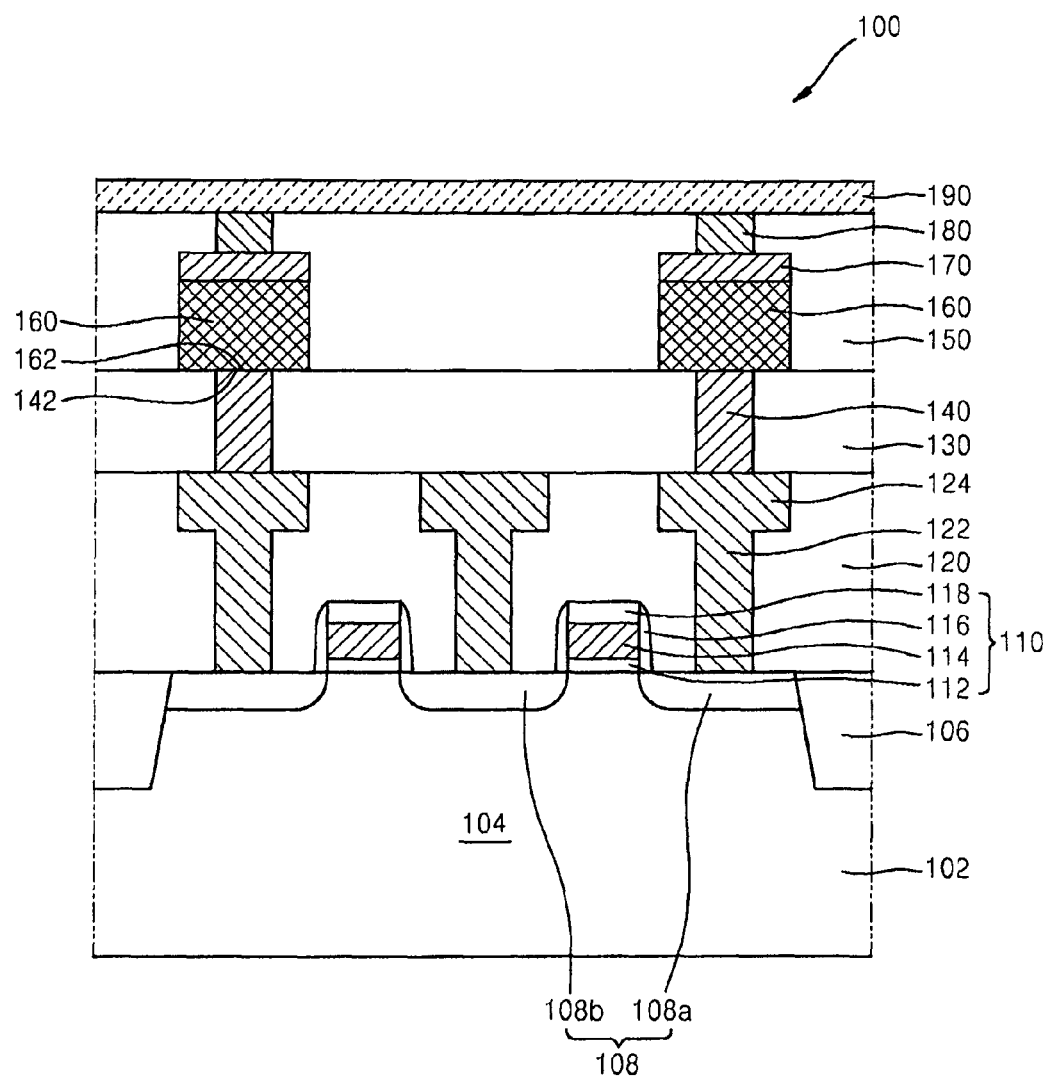
FIG. 3 is a cross-sectional view of a non-volatile memory device including a phase-change material according to some embodiments of the inventive concept.

FIG. 3 is a cross-sectional view of a non-volatile memory device 100 including a phase-change material according to some embodiments of the inventive concept.

Referring to FIG. 3, the non-volatile memory device 100 according to the present embodiment includes a gate structure 110, a lower electrode 140, a phase-change material layer 160, and an upper electrode 170, all of which are disposed on a substrate 102. The non-volatile memory device 100 may include a unit cell 10 including the memory portion 20 and the access portion 30 of FIG. 1. In the present embodiment, the memory portion 20 corresponds to a structure including the lower electrode 140, the phase-change material layer 160, and the upper electrode 170; and the access portion 30 corresponds to the gate structure 110.

The substrate 102 may include an isolation film 106 that defines an active region 104. The substrate 102 may further include a dielectric layer including, for example, silicon (Si) oxide, titanium (Ti) oxide, aluminum (Al) oxide, zirconium (Zr) oxide, or hafnium (Hf) oxide, a conductive layer including Ti, Ti nitride (TiN), Al, tantalum (Ta), Ta nitride (TaN), and/or TiAl nitride (TiAlN), or a semiconductor layer including Si, Si-germanium (SiGe), and/or Si carbide (SiC). The substrate 102 may also include an epitaxial layer, a silicon-on-insulator (SOI) layer, and/or a semiconductor-on-insulator (SEOI) layer. Although not shown in the drawings, the substrate 102 may further include a word line (not shown), a bit line (not shown), or other semiconductor devices. The isolation film 106 may be formed by typical shallow trench isolation (STI). An impurity region 108 is included in the active region 104. Although not shown in the drawings, the impurity region 108 may include a low-concentration impurity region disposed adjacent to the gate structure 110 and a high-concentration impurity region disposed relatively far from the gate structure 110. The impurity region 108 may serve as a source/drain region. For example, the impurity region 108 may include a source region 108*a* and a drain region 108*b*. The gate structure 110 is formed on the active region 104. The gate structure 110 includes a gate insulation layer 112, a gate electrode layer 114, a spacer 116, and a capping layer 118. The gate structure 110, the source region 108*a*, and the drain region 108*b* may form a MOS transistor, which serves as an access device. This structure is only an example, and the inventive concept is not limited thereto. In other words, the gate structure 110 may form a diode or a bipolar transistor instead of a MOS transistor.

A first interlayer insulation layer 120 covering the gate structure 110 is formed on the substrate 102. The first interlayer insulation layer 120 may include Si oxide and/or Si oxynitride. The first interlayer insulation layer 120 includes a first contact plug 122 that is electrically connected to the impurity region 106. In other words, the first contact plug 122 is electrically connected to the source region 108*a* or to the drain region 108*b*. As illustrated in FIG. 3, the first contact plug 122 may have an extension region 124 thereon, and the extension region 124 may increase the electrical contact area between the first contact plug 122 and the lower electrode 140. The first contact plug 122 may include, for example, Ti, TiN, tungsten (W), and/or W nitride (WN). The first contact plug 122 may have a stacked structure of the above-listed materials. The first contact plug 122 may be a single layer including one of the above-listed materials; a single layer including a plurality of materials selected from the above-listed materials; a multi-layer structure including multiple layers, each including one selected from the above-listed materials; or a multi-layer structure including multiple layers, each including a plurality of materials selected from the above-listed materials.

A second interlayer insulation layer 130 is formed on the first interlayer insulation layer 120. The second interlayer insulation layer 130 may include Si oxide, Si nitride, and/or Si oxynitride.

The lower electrode 140 is formed in the second interlayer insulation layer 130. The lower electrode 140 is formed on the first contact plug 122 and/or on the extension region 124 and is electrically connected to the first Contact plug 122. Accordingly, the lower electrode 140 is electrically connected to the gate structure 110 through the first contact plug 122 and the drain region 108*b*. The lower electrode 140 and the first contact plug 122 may be integrally formed as a one-piece body. The lower electrode 140 may be formed using a typical etching method, a damascene method, or a dual damascene method. The lower electrode 140 may include metal, for example, Al, Cu, W, Ti, or Ta, an alloy such as TiW or TiAl, or carbon (C). The lower electrode 140 may include at least one of TiN, TiAlN, Ta TaN, WN, molybdenum (Mo) nitride (MoN), niobium (Nb) nitride (NbN), TiSiN, Ti boron nitride (TiBN), ZrSiN, WSiN, WBN, ZrAlN, MoAlN, TaSiN, TaAlN, Ti oxynitride (TiON), TiAlON, WON, TaON, Ti carbonitride (TiCN), and/or TaCN. The lower electrode 140 may be a single layer including one of the above-listed materials; a single layer including a plurality of materials selected from the above-listed materials; a multi-layer structure including multiple layers, each including one of the above-listed materials; or a multi-layer structure including multiple layers, each including a plurality of materials selected from the above-listed materials. The lower electrode 140 may have a shape of an extended line or an array of a plurality of polyhedrons. Alternatively, the lower electrode 140 may have a ring shape filled with a material different from the lower electrode 140, for example, with an insulator. Although not shown in the drawings, an etching stop layer may be optionally formed on the lower electrode 140. The etching stop layer may include, for example, Si oxynitride (SiON), Hf oxide (HfO), or Al oxide ($Al_2O_3$). The etching stop layer may prevent the lower electrode 140 from being damaged by etching and the like performed in subsequent processes.

A third interlayer insulation layer 150 is formed on the second interlayer insulation layer 130. The third interlayer insulation layer 150 may include Si oxide, Si nitride, and/or Si oxynitride.

The phase-change material layer 160 is formed in the third interlayer insulation layer 150. The phase-change material layer 160 is formed on the lower electrode 140 and electrically connected to the lower electrode 140. The phase-change material layer 160 may be formed by sputtering, chemical vapor deposition (CVD), plasma enhanced CVD (PECVD), atomic layer deposition (ALD), or the like. Although not shown in the drawings, a seed layer may be further formed optionally between the lower electrode 140 and the phase-change material layer 160, and the seed layer facilitates the formation of the phase-change material layer 160. The area of a bottom surface 162 of the phase-change material layer 160 may be greater than that of a top surface 142 of the lower electrode 140. Accordingly, the crystalline status of a portion of the bottom surface 162 of the phase-change material layer 160 may be changed by the lower electrode 140.

The above-described phase-change material layer 160 is only an example, and the inventive concept is not limited thereto. Phase-change material layers according to embodiments of the inventive concept other than the phase-change material layer 160 will be described, below, with reference to FIGS. 4 through 6. The phase-change material layer 160 may include a phase-change material capable of storing data according to different crystalline status as described above, for example, chalcogenide, and may further include metal. The phase-change material layer 160 may be doped with C, nitrogen (N), Si, oxygen (O), bismuth (Bi), and/or tin (Sn). A driving current of the non-volatile memory device 100 may be reduced due to this doping. The phase-change material included in the phase-change material layer 160 will be described in greater detail with reference to FIG. 7.

The upper electrode 170 is formed on the phase-change material layer 160 and is electrically connected to the phase-change material layer 160. The upper electrode 170 may include metal, for example, Al, Cu, W, Ti, or Ta, or an alloy, for example, TiW or TiAl, or C. The upper electrode 170 may include at least one of TiN, TiAlN, Ta TaN, WN, MoN, NbN, TiSiN, TiBN, ZrSiN, WSiN, WBN, ZrAlN, MoAlN, TaSiN, TaAlN, TiON, TiAlON, WON, TaON, TiCN, and/or TaCN. The upper electrode 170 may be a single layer including one of the above-listed materials, a single layer including a plurality of materials selected from the above-listed materials, a multi-layer structure including multiple layers each including one of the above-listed materials, or a multi-layer structure including multiple layers each including a plurality of materials selected from the above-listed materials. The lower electrode 140 and the upper electrode 170 may be formed of an identical material or may be formed of different materials.

A second contact plug 180 is formed on the upper electrode 170 and is electrically connected to the upper electrode 170. The second contact plug 180 may include Ti, TiN, W, and/or WN. The second contact plug 180 may have a stacked structure of the above-listed materials. The second contact plug 180 may be a single layer including one of the above-listed materials; a single layer including a plurality of materials selected from the above-listed materials; a multi-layer structure including multiple layers, each including one of the above-listed materials; or a multi-layer structure including multiple layers, each including a plurality of materials selected from the above-listed materials. The upper electrode 170 and the second contact plug 180 may be integrally formed as a one-piece body. An upper wiring 190 is formed on the second contact plug 180, and the second contact plug 180 is electrically connected to the upper wiring 190.

As described above, the first interlayer insulation layer 120, the first contact plug 122, the second interlayer insulation layer 130, the lower electrode 140, the third interlayer insulation layer 150, the phase-change material layer 160, the upper electrode 170, the second contact plug 180, and the upper wiring 190 may be formed by sputtering, CVD, PECVD, ALD, or the like. The layers may be formed by using a typical photolithographic method, an etching method, a planarization method such as chemical mechanical polishing (CMP) or dry etching.

Figure 4:
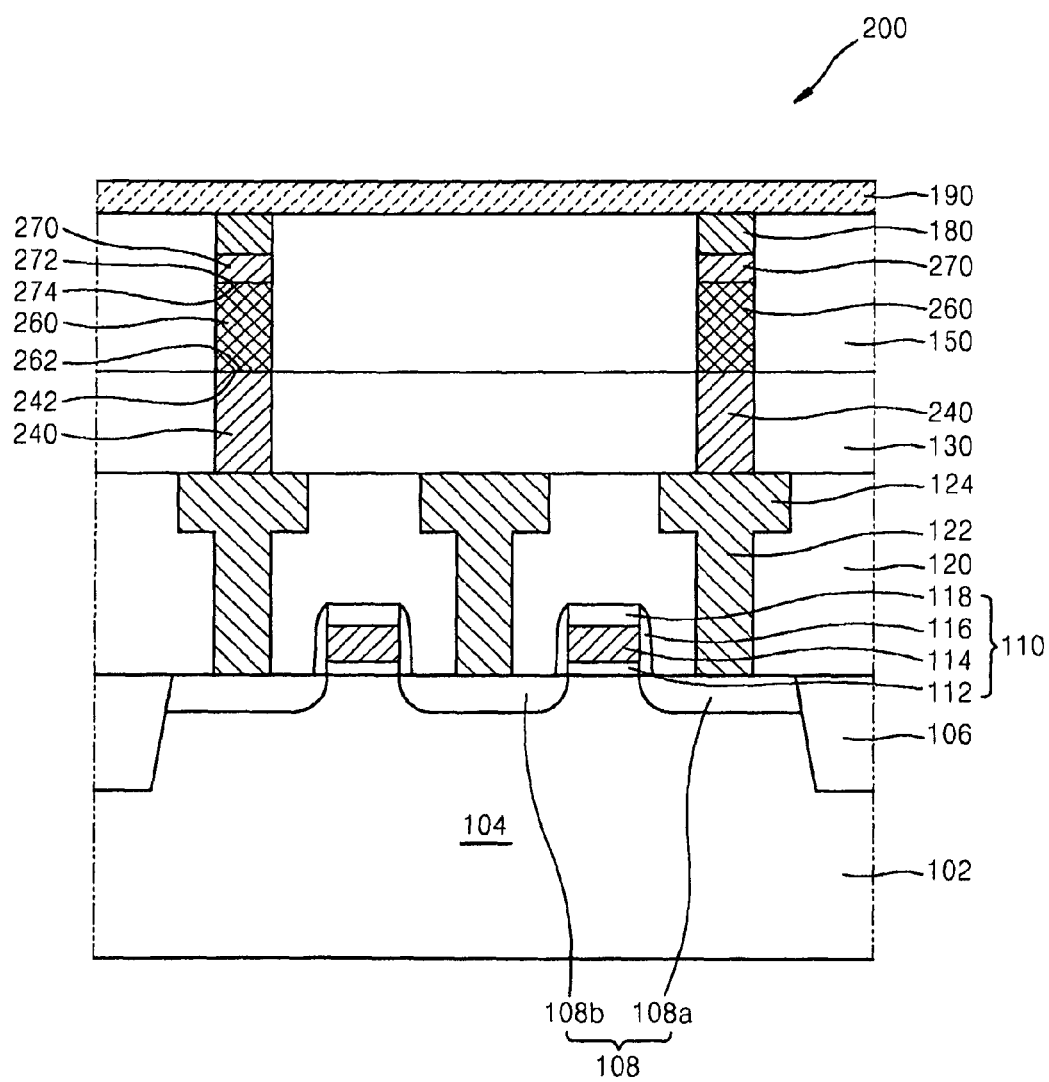
FIGS. 4 through 6 are cross-sectional views of non-volatile memory devices including a phase-change material according to some embodiments of the inventive concept.
Figure 5:
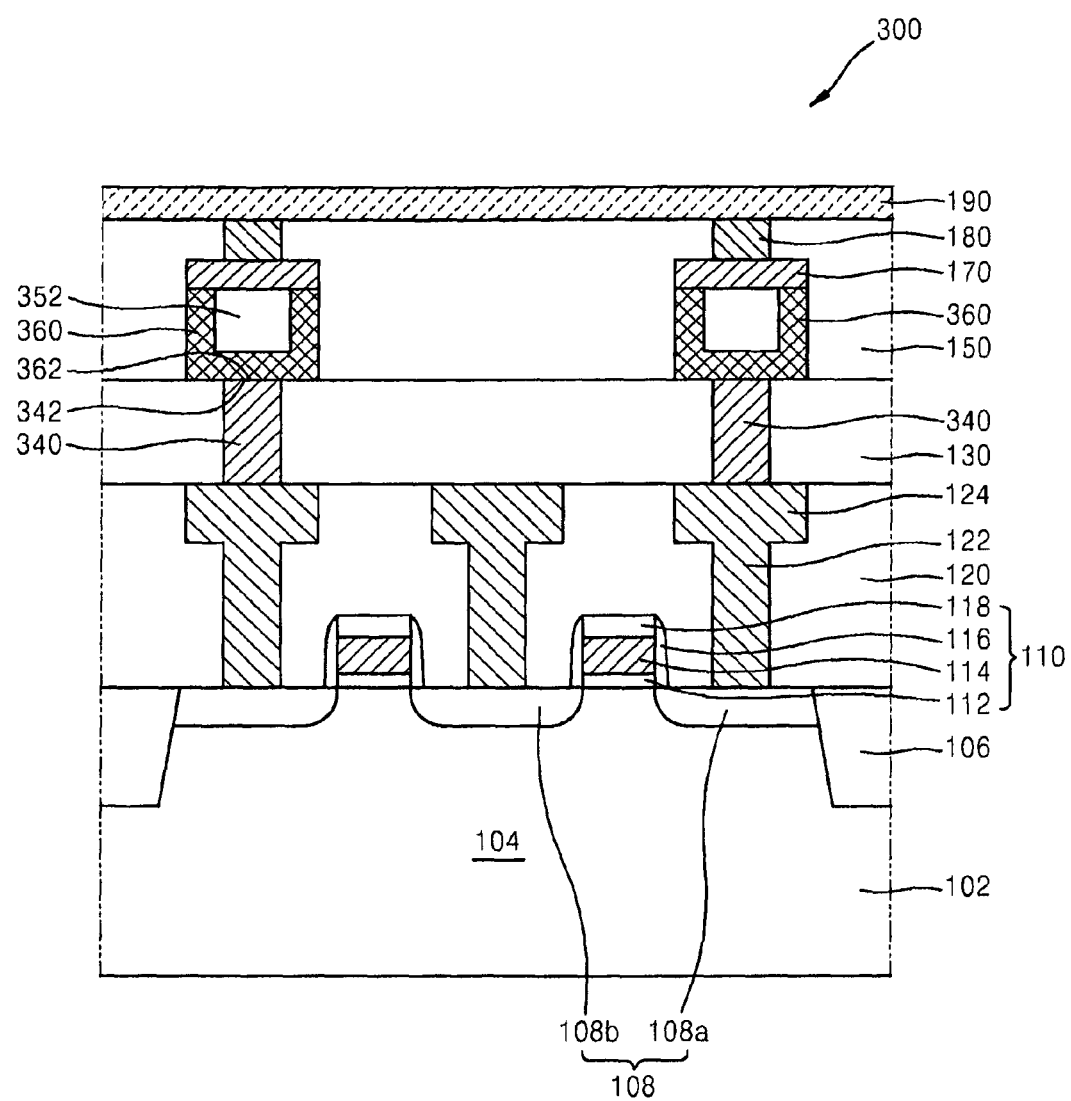
Figure 6:
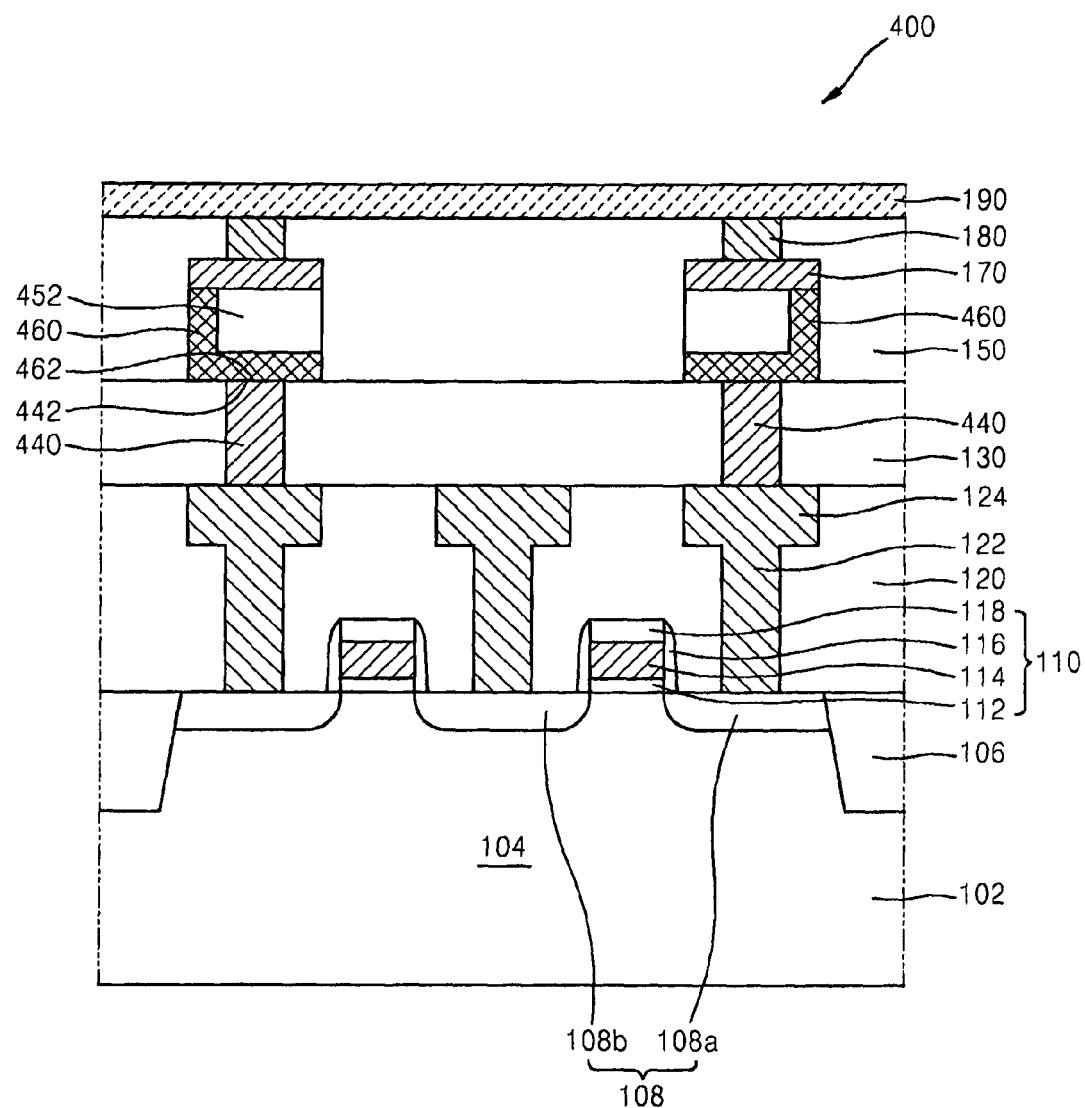

Cross-sectional views of non-volatile memory devices 200, 300, and 400 including a phase-change material according to some embodiments of the inventive concept are provided in FIGS. 4 through 6. Elements that are substantially the same as or equivalent to those in FIG. 3 will not be described again in the following description about FIGS. 4 through 6.

Referring to FIG. 4, the area of a bottom surface 262 of a phase-change material layer 260 may be substantially the same as that of a top surface 242 of a lower electrode 240. Accordingly, the crystalline status of the entire bottom surface 262 of the phase-change material layer 260 may be changed by the lower electrode 240. The area of a top surface 264 of the phase-change material layer 260 may be substantially the same as that of a bottom surface 272 of an upper electrode 270.

Referring to FIG. 5, a phase-change material layer 360 may include a first inner insulation layer 352. The phase-change material layer 360 may have a "U"-shaped cross section structure that covers both side surfaces and the bottom surface of the first inner insulation layer 352. As in the embodiment illustrated in FIG. 3, the area of a bottom surface 362 of the phase-change material layer 360 may be greater than that of a top surface 342 of a lower electrode 340. Alternatively, as in the embodiment illustrated in FIG. 4, the area of the bottom surface 362 of the phase-change material layer 360 may be substantially the same as that of the top surface 342 of the lower electrode 340. The first inner insulation layer 352 may include Si oxide, Si nitride, and/or Si oxynitride. Although not shown in the drawings, a lining layer may be optionally formed between the phase-change material layer 360 and the first inner insulation layer 352. The lining layer may include, for example, Si nitride (SiN). The lining layer may prevent the phase-change material layer 360 from being damaged by etching and the like performed in subsequent processes.

Referring to FIG. 6, a phase-change material layer 460 may include a second inner insulation layer 452. The phase-change material layer 460 may have a "L"-shaped cross section structure that covers one side surface and a bottom surface of the second inner insulation layer 452. As in the embodiment illustrated in FIG. 3, the area of a bottom surface 462 of the phase-change material layer 460 may be greater than that of a top surface 442 of a lower electrode 440. Alternatively, as in the embodiment illustrated in FIG. 4, the area of the bottom surface 462 of the phase-change material layer 460 may be substantially the same as that of the top surface 442 of the lower electrode 440. The second inner insulation layer 452 may include Si oxide, Si nitride, and/or Si oxynitride. Although not shown in the drawings, a lining layer may be optionally formed between the phase-change material layer 460 and the second inner insulation layer 452. The lining layer may include, for example, SiN. The lining layer may prevent the phase-change material layer 460 from being damaged by etching and the like performed in subsequent processes.

A phase-change material used to form the phase-change material layers 160, 260, 360, and 460 included in the non-volatile memory devices 100, 200, 300, and 400, respectively, will now be described.

The phase-change material layers 160, 260, 360, and 460 may include a material capable of storing data according to different crystalline statuses, as described above (for example, a phase-change material, such as chalcogenide), and may further include metal. The phase-change material layers 160, 260, 360, and 460 may be doped with C, N, Si, O, Bi, and/or Sn. A driving current of the memory devices 100, 200, 300, and 400 may be reduced due to this doping.

Figure 7:
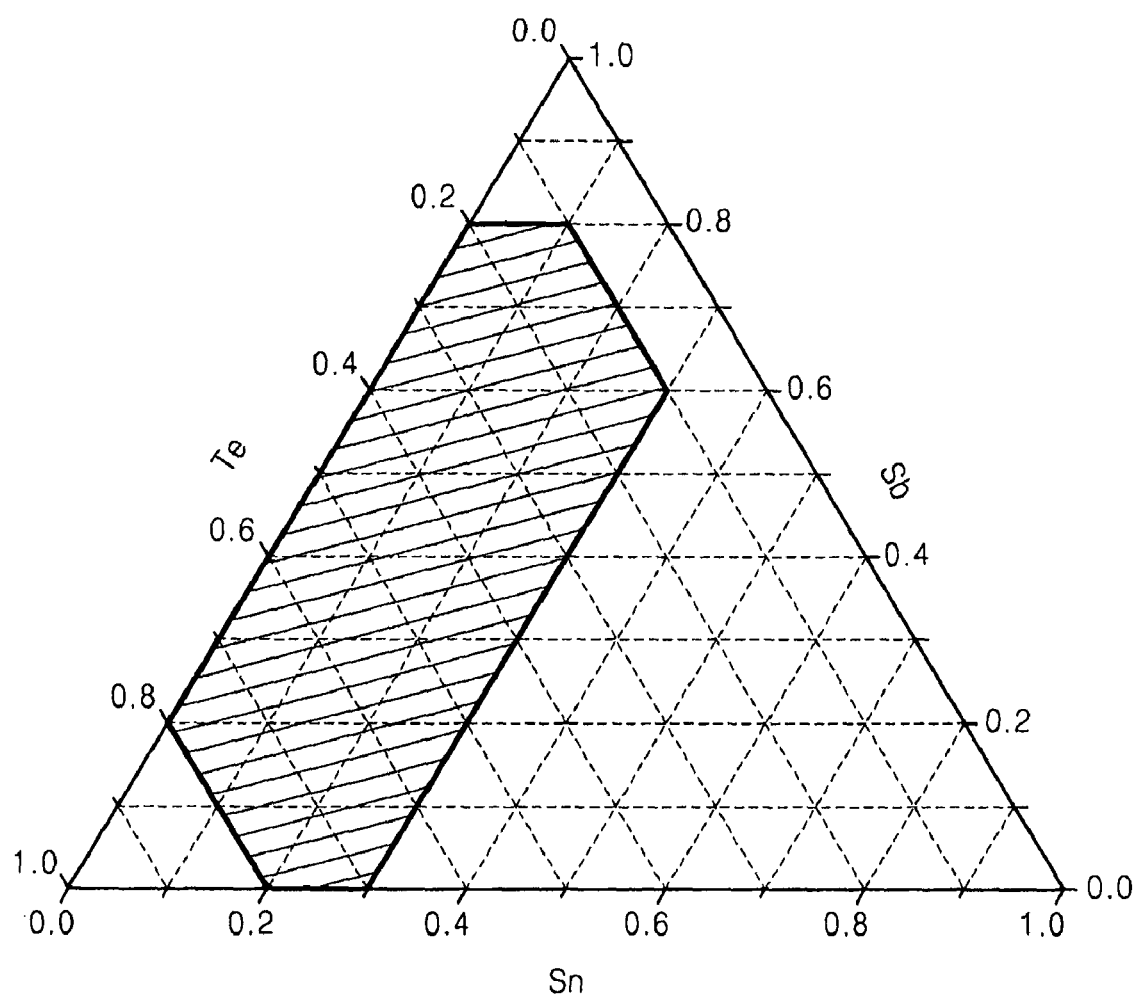
FIG. 7 is a ternary phase diagram illustrating a composition range of a phase-change layer included in the non-volatile memory devices illustrated in FIGS. 2 through 6.

FIG. 7 is a ternary phase diagram illustrating a composition range of the phase-change material used to form the phase-change material layers 160, 260, 360, and 460 of the non-volatile memory devices 100, 200, 300, and 400, illustrated in FIGS. 2 through 6. The phase-change material may include tin (Sn), antimony (Sb), and tellurium (Te). For example, the phase-change material may have a composition represented by Formula 1, below, and this composition corresponds to a shaded portion in FIG. 7. Composition ranges of elements shown in Formulas 1 through 9 are represented as atomic ratios.

$$Sn_X Sb_Y Te_Z,\qquad\text{[Formula 1]}$$

where $0.001 \leq X \leq 0.3$, $0.001 \leq Y \leq 0.8$, $0.1 \leq Z \leq 0.8$, and $X+Y+Z=1$.

The phase-change material used to form the phase-change material layers 160, 260, 360, and 460 will now be described in greater detail.

As described above, the phase-change material layers 160, 260, 360, and 460 include Sn, Sb, and Te. In this regard, the phase-change material layers 160, 260, 360, and 460 may include Sn in an atomic ratio of 0.001 to 0.3, Sb in an atomic ratio of 0.001 to 0.8, and Te in an atomic ratio of 0.001 to 0.8. A Sn—Sb—Te ternary material forms various solid solutions or intermetallic compounds. For example, Sn and Sb may form solid solutions expressed by $\alpha$, $\beta$, $\gamma$, and $\delta$ as the content of Sb increases, but do not form an intermetallic compound having a fixed formula amount. Sn and Te may form an intermetallic compound of SnTe having a melting point of about 790° C. Sb and Te may form solid solutions expressed by $\alpha$, $\beta$, $\gamma$, and $\delta$ and an intermetallic compound of $Sb_2Te_3$ having a melting point of about 620° C. as the content of Te increases. The two intermetallic compounds, namely, SnTe and $Sb_2Te_3$, have a melting point difference of 160° C. or greater and perform a peritectic reaction. When the two, intermetallic compounds are formed, phase separation occurs, and thus the two intermetallic compounds are not suitable to be used as a phase-change material for memory devices. Accordingly, a composition capable of preventing formation of such intermetallic compounds is advantageous.

For example, if the atomic ratio of Sn exceeds 0.3, retention characteristics may be degraded, and the time and current required for a reset operation may increase or a reset voltage may rapidly increase. On the other hand, if the atomic ratio of Sn is less than 0.01, an operating speed of a non-volatile memory device may decrease. If the content of Sb exceeds 0.8, the amount of current required for the reset operation may increase and retention characteristics may be degraded. If the atomic ratio of Sb is less than 0.01, the thermal resistance characteristics of the phase-change material layer 160, 260, 360, and 460 may significantly decrease, or sublimation of the phase-change material may increase while manufacturing the memory device. This makes the manufacture of memory devices difficult. If the atomic ratio of Te exceeds 0.8, the thermal stability of phase-change material layers may deteriorate.

At least a portion of each of the Sn, Sb, and Te included in the phase-change material used to form the phase-change material layers 160, 260, 360, and 460 may be replaced by another material. The type of the replacing material may depend on the characteristics of a desired memory device. For example, indium (In), Si, arsenic (As), and selenium (Se) reinforce amorphization of a phase-change material. On the other hand, Sn and Bi reinforce crystallization of a phase-change material. The replacement material can be selected from the same group as the material from which a portion is to be replaced, as in the cases of Sb and Te; or a replacement material can be selected from a group adjacent to that of the material from which a portion is to be replaced, as in the case of Sn.

According to some embodiments of the inventive concept, a portion or all of the Sn in Formula 1 may be replaced by Si and/or In, and thus the phase-change material may have a composition represented by Formula 2, as follows.

$$(Sn_U R_{(1-U)})_X Sb_Y Te_Z,\quad \text{[Formula 2]}$$

where $0.001 \leq X \leq 0.3$, $0.001 \leq Y \leq 0.8$, $0.1 \leq Z \leq 0.8$, $X+Y+Z=1$, R is Si and/or In, and $0 \leq U \leq 1$.

According to some embodiments of the inventive concept, a portion or all of the Sb in Formula 1 may be replaced by As, Bi, or both of them, and thus the phase-change material may have a composition represented by Formula 3, as follows.

$$Sn_X(Sb_V Q_{(1-V)})_Y Te_Z,\quad \text{[Formula 3]}$$

where $0.001 X \leq 0.3$, $0.001 \leq Y \leq 0.8$, $0.1 \leq Z \leq 0.8$, $X+Y+Z=1$, Q is As and/or Bi, and $0 \leq V \leq 1$.

According to some embodiments of the inventive concept, a portion or all of the Te in Formula 1 may be replaced by Se, and thus the phase-change material may have a composition represented by Formula 4, as follows.

$$Sn_X Sb_Y(Te_W Se_{(1-W)})_Z,\quad \text{[Formula 4]}$$

where $0.001 X \leq 0.3$, $0.001 \leq Y \leq 0.8$, $0.1 \leq Z \leq 0.8$, $X+Y+Z=1$, and $0 \leq W \leq 1$.

According to some embodiments of the inventive concept, a portion or all of the Sn in Formula 1 may be replaced by Si and/or In; and a portion or all of the Sb in Formula 1 may be replaced by As and/or Bi; and thus the phase-change material may have a composition represented by Formula 5, as follows.

$$(Sn_U R_{(1-U)})_X (Sb_V Q_{(1-V)})_Y Te_Z,\quad \text{[Formula 5]}$$

where $0.001 \leq X \leq 0.3$, $0.001 \leq Y \leq 0.8$, $0.1 \leq Z \leq 0.8$, $X+Y+Z=1$, R is Si and/or In, $0 \leq U \leq 1$, Q is As and/or Bi, and $0 \leq V \leq 1$.

According to some embodiments of the inventive concept, a portion or all of the Sn in Formula 1, may be replaced by Si and/or In, and a portion or all of the Te in Formula 1 may be replaced by Se, and thus the phase-change material may have a composition represented by Formula 6, as follows.

$$(Sn_U R_{(1-U)})_X Sb_Y(Te_W Se_{(1-W)})_Z,\quad \text{[Formula 6]}$$

where $0.001 \leq X \leq 0.3$, $0.001 \leq Y \leq 0.8$, $0.1 \leq Z \leq 0.8$, $X+Y+Z=1$, R is Si and/or In, $0 \leq U \leq 1$, and $0 \leq W \leq 1$.

According to some embodiments of the inventive concept, a portion or all of the Sb in Formula 1 may be replaced by As and/or Bi, and a portion or all of the Te in Formula 1 may be replaced by Se, and thus the phase-change material may have a composition represented by Formula 7, as follows.

$$Sn_X(Sb_V Q_{(1-V)})_Y(Te_W Se_{(1-W)})_Z,\quad \text{[Formula 7]}$$

where $0.001 \leq X \leq 0.3$, $0.001 \leq Y \leq 0.8$, $0.1 \leq Z \leq 0.8$, $X+Y+Z=1$, Q is As and/or Bi, $0 \leq V \leq 1$, and $0 \leq W \leq 1$.

According to some embodiments of the inventive concept, a portion or all of the Sn in Formula 1, may be replaced by Si and/or In, a portion or all of the Sb in Formula 1 may be replaced by As and/or Bi, and a portion or all of the Te in Formula 1 may be replaced by Se, and thus the phase-change material may have a composition represented by Formula 8, as follows.

$$(Sn_U R_{(1-U)})_X(Sb_V Q_{(1-V)})_Y(Te_W Se_{(1-W)})_Z,\quad \text{[Formula 8]}$$

where $0.001 \leq X \leq 0.3$, $0.001 \leq Y \leq 0.8$, $0.1 \leq Z \leq 0.8$, $X+Y+Z=1$, R is Si and/or In, $0 \leq U \leq 1$, Q is As and/or Bi, $0 \leq V \leq 1$, and $0 \leq W \leq 1$.

According to some embodiments of the inventive concept, the phase-change material may further include metal. In this case, the phase-change material may have a composition represented by Formula 9, as follows.

$$M_A(Sn_X Sb_Y Te_Z)_{(1-A)},\quad \text{[Formula 9]}$$

where M is a metal, $0.001 \leq A \leq 0.3$, $0.001 X \leq 0.3$, $0.001 \leq Y \leq 0.8$, $0.1 \leq Z \leq 0.8$, and $X+Y+Z=1$.

The metal may include a transition metal. The metal may include at least one selected from the group consisting of aluminum (Al), gallium (Ga), zinc (Zn), titanium (Ti), chromium (Cr), manganese (Mn), iron (Fe), cobalt (Co), nickel (Ni), molybdenum (Mo), ruthenium (Ru), palladium (Pd), hafnium (Hf), tantalum (Ta), iridium (Ir), platinum (Pt), zirconium (Zr), thallium (Tl), palladium (Pd), and polonium (Po). These metal materials may increase electrical conductivity and thermal conductivity of the phase-change material layers 160, 260, 360, and 460. Thus, crystallization speed is increased; and, thus, set speed may be increased. In addition, data retention characteristics may be improved. In Formula 9, as described above with reference to Formulas 2 through 8, a portion or all of the Sn included in the phase-change material may be replaced by Si and/or In, and/or a portion or all of the Sb included in the phase-change material may be replaced by As and/or Bi, and/or a portion or all of the Te included in the phase-change material may be replaced by Se.

The above-described materials used to form the phase-change material layers 160, 260, 360, and 460; for example, Sn, In, and Si, may be included in the phase-change material layers 160, 260, 360, and 460 by sputtering, CVD, ALD, ion implantation doping, or diffusion doping. Each of the phase-change material layers 160, 260, 360, and 460 may have an entirely uniform composition or may have a multi-layer structure having different compositions. For example, at least one of the materials used to form the multi-layer structure may have a graded concentration. For example, in the graded concentration, the concentration of Sn may increase or decrease in a depth direction of the phase-change material layers 160, 260, 360, and 460.

Figure 8:
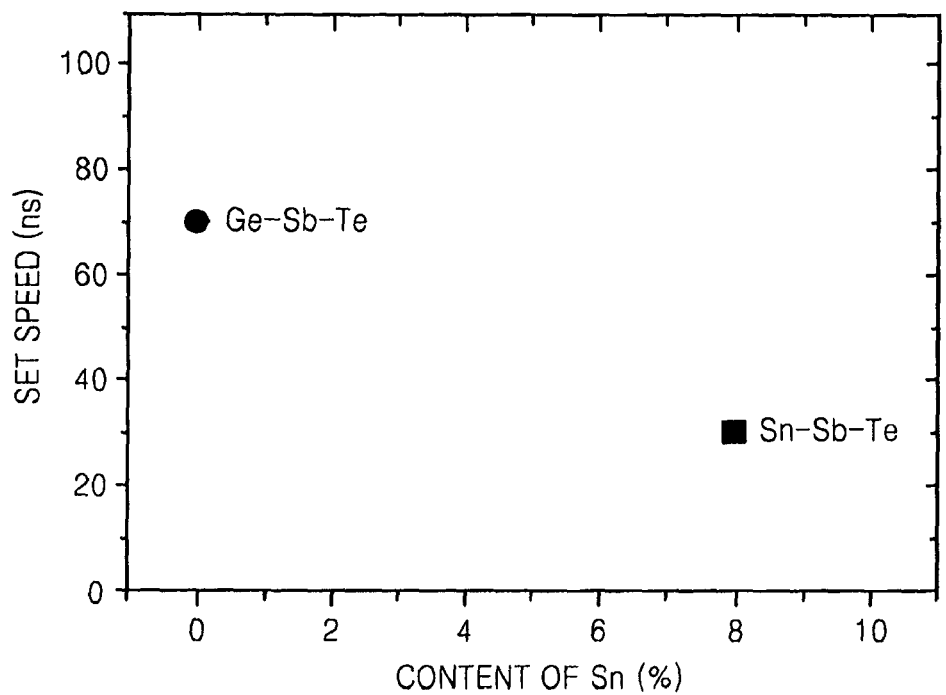
FIG. 8 is a graph showing a comparison between a set speed of a non-volatile memory device including a Sn—Sb—Te phase-change material according to some embodiments of the inventive concept and a set speed of a conventional non-volatile memory device including a Ge—Sb—Te phase-change material.

FIG. 8 is a graph showing a comparison between a set speed of the non-volatile memory device including a Sn—Sb—Te phase-change material and a set speed of a conventional non-volatile memory device including a Ge—Sb—Te phase-change material.

Referring to FIG. 8, the conventional non-volatile memory device including the Ge—Sb—Te phase-change material has a set speed of about 70 ns (nanosecond), whereas the non-volatile memory device having a Sn—Sb—Te phase-change material including 8% of Sn has a set speed of about 30 ns.

The low set speed of the Sn—Sb—Te phase-change material means a fast change into a set state (that is, a crystalline state).

Figure 9:
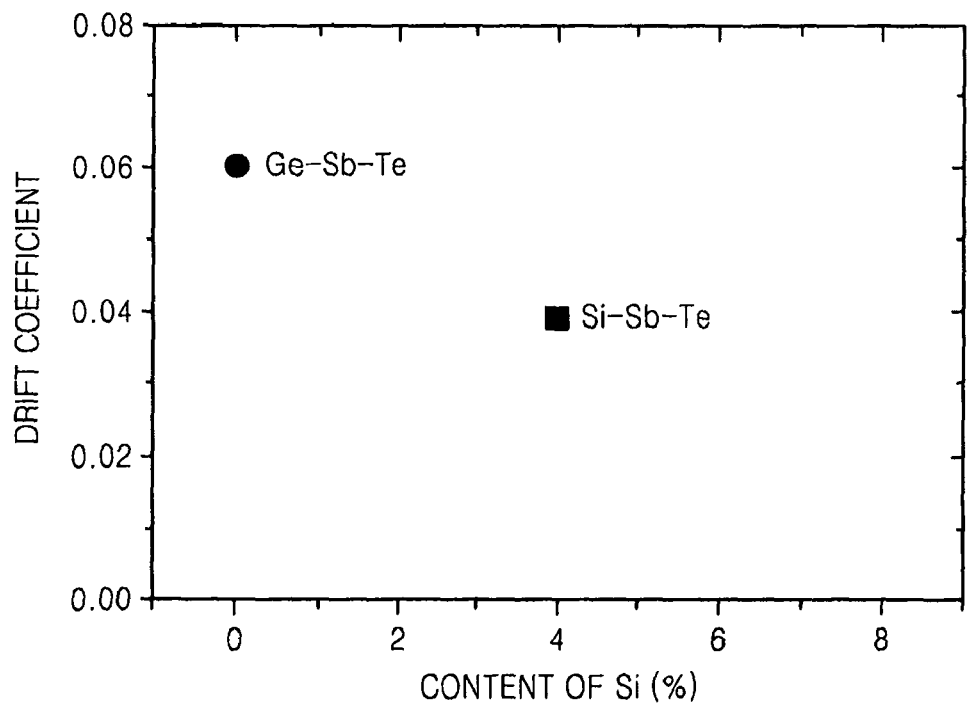
FIG. 9 is a graph showing a comparison between a drift coefficient of a non-volatile memory device including a Si—Sb—Te phase-change material according to some embodiments of the inventive concept and a drift coefficient of a conventional non-volatile memory device including a Ge—Sb—Te phase-change material.

FIG. 9 is a graph showing a comparison between a drift coefficient of the non-volatile memory device including a Si—Sb—Te phase-change material and a drift coefficient of the conventional non-volatile memory device including the Ge—Sb—Te phase-change material.

Referring to FIG. 9, the conventional non-volatile memory device including the Ge—Sb—Te phase-change material has a drift coefficient of about 0.06, whereas the non-volatile memory device having a Si—Sb—Te phase-change material including 4% of Si has a drift coefficient of about 0.04. A drift coefficient indicates the degree of resistance variation according to the time when a memory device is in an amorphous state (that is, a reset state). The lower the drift coefficient is, the greater the stability of a phase-change material is, and thus the higher the reliability of the memory device. In particular, a low drift coefficient is advantageous for forming multi-level cells.

Figure 10:
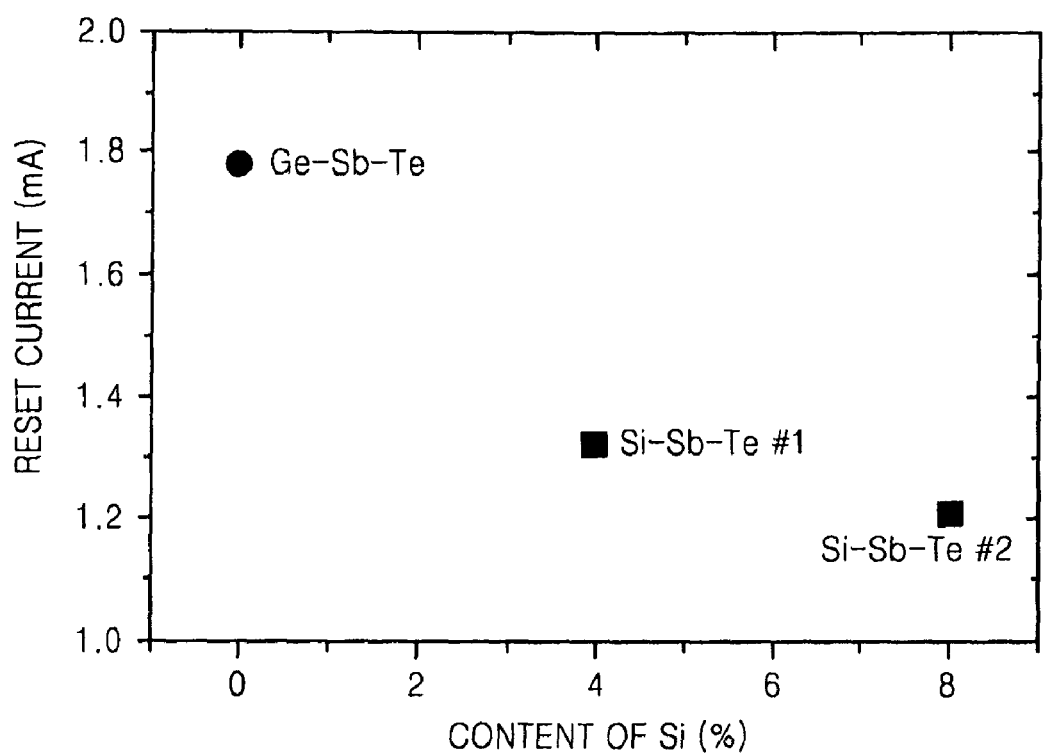
FIG. 10 is a graph showing a comparison between a rest current of a non-volatile memory device including a Si—Sb—Te phase-change material according to some embodiments of the inventive concept and a reset current of a conventional non-volatile memory device including a Ge—Sb—Te phase-change material.

FIG. 10 is a graph showing a comparison between a rest current of non-volatile memory devices including a Si—Sb—Te phase-change material and a reset current of the conventional non-volatile memory device including the Ge—Sb—Te phase-change material.

Referring to FIG. 10, the conventional non-volatile memory device including the Ge—Sb—Te phase-change material has a reset current of about 1.8 mA, whereas the non-volatile memory device having a Si—Sb—Te phase-change material including 4% of Si (that is, in the case Si—Sb—Te #1) has a reset current of about 1.3 mA, and the non-volatile memory device 100 having a Si—Sb—Te phase-change material including 8% of Si (that is, in the case Si—Sb—Te #2) has a reset current of about 1.2 mA. The reset current denotes a current required to change the crystalline state of a phase-change material to the amorphous state. Thus, the lower the reset current, the lower the power consumption and the greater the durability of the non-volatile memory device. In particular, a low reset current is advantageous for forming multi-level cells.

As described above, compared with the conventional non-volatile memory device including the Ge—Sb—Te phase-change material, a memory device using a phase-change material including Sn according to the inventive concept has a low set speed, thereby increasing the operating speed of the memory device. Compared with the conventional non-volatile memory device including the Ge—Sb—Te phase-change material, a memory device using a phase-change material including Si according to the inventive concept has a low drift coefficient, thereby increasing the reliability of the memory device. Compared with the conventional non-volatile memory device including the Ge—Sb—Te phase-change material, the memory device using the phase-change material including Si according to the inventive concept has a low reset current; consequently, the memory device may have low power consumption, a fast operating speed, and a long life span; and multi-level cells may be easily formed. Compared with the conventional non-volatile memory device including the Ge—Sb—Te phase-change material, a memory device using a phase-change material including In according to the inventive concept has a reset resistance increased by about two orders of magnitude. Thus, an interval between the reset resistance and a set resistance is increased; and, thus, multi-level cells may be easily formed.

Figure 11:
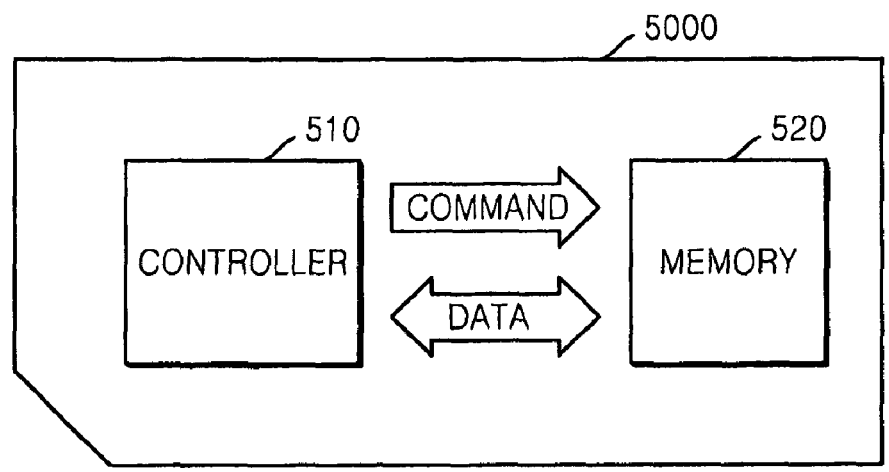
FIG. 11 is a schematic diagram of a card according to some embodiments of the inventive concept.

An embodiment of a memory card 5000 according to an aspect of the inventive concept is schematically illustrated in FIG. 11.

Referring to FIG. 11, a controller 510 and a memory 520 are disposed to send/receive electric signals to/from each other. For example, when the controller 510 gives a command to the memory 520, the memory 520 can send data. The memory 520 may include the non-volatile memory device having a phase-change material according to an embodiment of the inventive concept. The non-volatile memory devices according to the various embodiments of the inventive concept can be disposed in various architecture arrays in correspondence to the logic gate design. The memory arrays disposed in a plurality of rows and columns can have one or more memory array bank (not shown). The memory 520 can include a memory array (not shown) or a memory array bank (not shown). The memory card 5000 can further include conventional members, such as a conventional row decoder (not shown), a column decoder (not shown), input/output (I/O) buffers (now shown), and/or a control resistor (not shown) in order to drive the memory array bank (not shown). The memory card 5000 can be used in memory devices as, for example, a memory card [such as a memory stick card, a smart media (SM) card, a secure digital (SD) card, a mini SD card, or a multi media card (MMC)].

Figure 12:
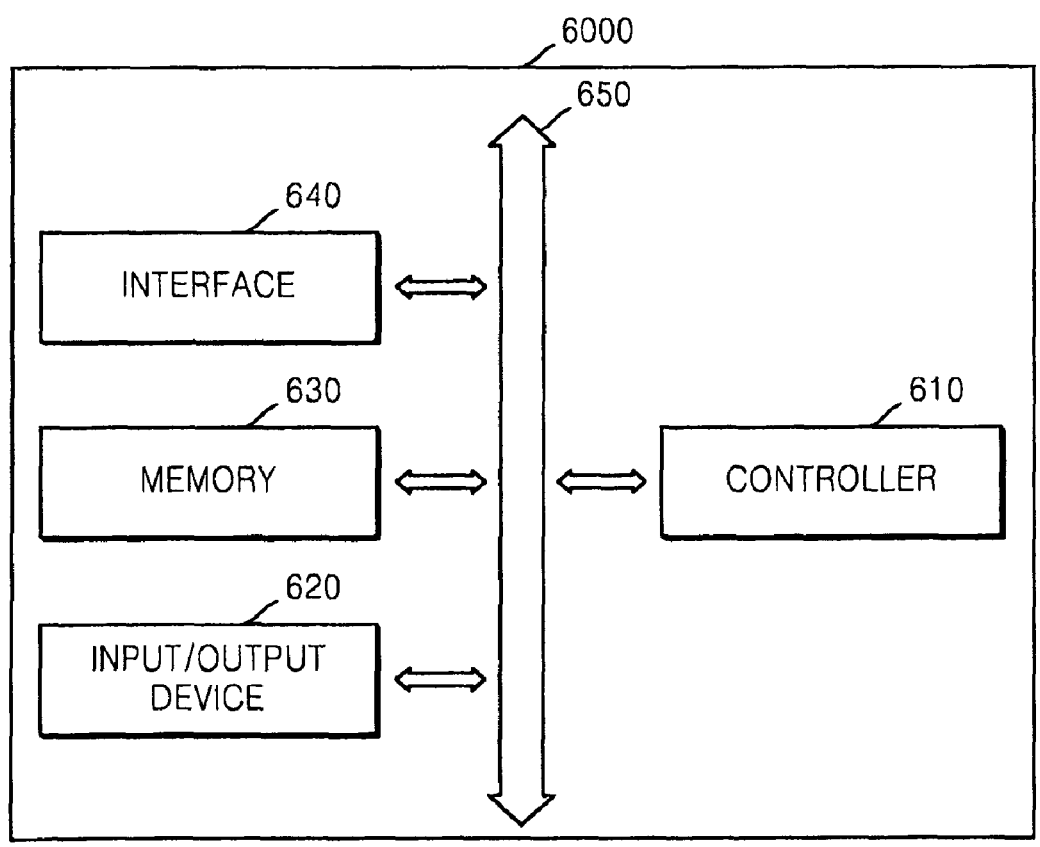
FIG. 12 is a schematic diagram of a system according to some embodiments of the inventive concept.

A system 6000 including a non-volatile memory device according to an embodiment of the inventive concept is schematically illustrated in FIG. 12.

Referring to FIG. 12, the system 6000 may include a controller 610, an input/output device 620, a memory 630, and an interface 640. The system 6000 may be a mobile system or a system that transmits or receives data. The mobile system may be a personal digital assistant (PDA), a portable computer, a web tablet, a wireless phone, a mobile phone, a digital music player, or a memory card. The controller 610 executes a software program and controls the system 6000. The controller 610 may be a microprocessor, a digital signal processor, a microcontroller, or the like. The input/output device 630 can be used to input or output data of the system 6000. The system 6000 is connected to an external apparatus, for example, a personal computer or a network, using the input/output device 620, to send/receive data to/from the external apparatus. The input/output device 620 may be a keypad, a keyboard, or a display. The memory 630 may store codes and/or data for operating the controller 610 and/or may store data processed by the controller 610. The memory 630 may include a non-volatile memory device according to an embodiment of the inventive concept. The interface 640 may be a data transmission path between the system 6000 and an external apparatus. The controller 610, the input/output device 620, the memory 630, and the interface 640 may communicate with one another by a bus 650. For example, the system 6000 can be used for a mobile phone, a MP3 player, a navigation system, a portable multimedia player (PMP), a solid state disk (SSD), or a household appliance.

The foregoing is illustrative of exemplary embodiments and is not to be construed as limiting thereof. Although exemplary embodiments have been described, those of ordinary skill in the art will readily appreciate that many modifications are possible in the exemplary embodiments without materially departing from the novel teachings and advantages of the exemplary embodiments. Accordingly, all such modifications are intended to be included within the scope of the claims. Exemplary embodiments are defined by the following claims, with equivalents of the claims to be included therein.

What is claimed is:

1. A non-volatile memory device comprising:
a lower electrode;
a phase-change material layer formed on the lower electrode so as to be electrically connected to the lower electrode, wherein the phase-change material layer comprises a phase-change material having a composition represented by at least one of Formulas 3, 4 and 7, below; and an upper electrode formed on the phase-change material layer so as to be electrically connected to the phase-change material layer;

$$Sn_X(Sb_VQ_{(1-V)})_YTe_Z, \quad \text{[Formula 3]}$$

$$Sn_XSb_Y(Te_WSe_{(1-W)})_Z, \quad \text{[Formula 4]}$$

$$Sn_X(Sb_VQ_{(1-V)})_Y(Te_WSe_{(1-W)})_Z, \quad \text{[Formula 7]}$$

where Q, when present, includes at least one of arsenic (As) and bismuth (Bi); $0 \leq V \leq 1$; $0 \leq W \leq 1$; $0.001 \leq X \leq 0.3$; $0.001 \leq Y \leq 0.8$; $0.1 \leq Z \leq 0.8$; $V+W<2$; and $X+Y+Z=1$.

2. The non-volatile memory device of claim 1, wherein the phase-change material has a composition represented by Formula 3, below:

$$Sn_X(Sb_VQ_{(1-V)})_YTe_Z. \quad \text{[Formula 3]}$$

3. The non-volatile memory device of claim 1, wherein the phase-change material has a composition represented by Formula 4, below:

$$Sn_XSb_Y(Te_WSe_{(1-W)})_Z. \quad \text{[Formula 4]}$$

4. The non-volatile memory device of claim 1, wherein the phase-change material has a composition represented by Formula 7, below:

$$Sn_X(Sb_VQ_{(1-V)})_Y(Te_WSe_{(1-W)})_Z. \quad \text{[Formula 7]}$$

* * * * *